United States Patent [19]
Tai

[11] Patent Number: 6,038,662
[45] Date of Patent: Mar. 14, 2000

[54] BUBBLE EVAPORATION CIRCUIT FOR ELIMINATING BUBBLE ERRORS IN THERMAL CODE AND ITS METHOD

[75] Inventor: Jy-Der David Tai, Hsin-Chu, Taiwan

[73] Assignee: Powerchip Semiconductor Corp., Hsin-Chu, Taiwan

[21] Appl. No.: 09/022,859

[22] Filed: Feb. 12, 1998

[51] Int. Cl.[7] .................................................. G06F 7/04
[52] U.S. Cl. ........................................ 712/300; 714/819
[58] Field of Search .......................... 712/300; 341/100, 341/119, 155; 714/819

[56] References Cited

U.S. PATENT DOCUMENTS

| | | | |
|---|---|---|---|
| 4,961,180 | 10/1990 | Schwartz et al. | 370/110.1 |
| 5,640,607 | 6/1997 | Murray | 395/888 |

OTHER PUBLICATIONS

Yuji Gendai, et al., IEEE International Solid State Circuits Conference/ Paper TP 10.5/ pp. 172–173/ Feb.14, 1991/"An 8b 500 MHz ADC".

Bang–Sup Song, et al. "A 10–b 15–MHz CMOS Recycling Two–Step A/D Converter," IEEE Journal of Solid State Circuits, vol. 25, No. 6, pp. 1328–1338, Dec. 1990.

*Primary Examiner*—John A. Follansbee
*Attorney, Agent, or Firm*—Ladas & Parry

[57] ABSTRACT

A circuit for eliminating bubble errors occurring in a thermal code, which is comprised of a plurality of data bits, and its operation method are disclosed. The circuit is implemented by a plurality of interchange units, each of which processes one of the data bits, respectively. When any two successive data bits present a predetermined pattern, an interchange operation between the associated interchange units is continuously performed until the predetermined pattern is completely removed. Accordingly, the electronic bubble evaporation circuit developed in accordance with the present invention can eliminate bubble errors occurring in the thermal code even if the bubbles occur randomly.

8 Claims, 3 Drawing Sheets

BUBBLE EVAPORATION CIRCUIT FOR ELIMINATING BUBBLE ERRORS IN THERMAL CODE AND ITS METHOD

BACKGROUND TO THE INVENTION

1. Scope of the Invention

The present invention is in the field of analog-to digital conversion techniques More specifically, the present invention involves an electronic bubble evaporation circuit for correcting a thermal code suffering from bubble errors and its method.

2. Description of the Prior Art

A flash-type analog-to-digital converter (hereafter "ADC"), possesses faster ways to achieve analog-to-digital conversion than counting ADCs, successive-approximation ADCs, or ratiometric ADCs. The flash-type ADC is also termed a "parallel-comparator ADC" for the reason that several comparators are utilized for parallel comparison with a number of reference voltages, respectively. In recent years, subranging two-step conversion architectures, which divide one comparison process into a coarse decision cycle and a fine decision cycle, have been developed because the fully parallel ADC makes great demands for layout area and power consumption. See B. S. Song et al., "A 10-b 15-MHz CMOS RECYCLING TWO-STEP A/D CONVERTER," *IEEE Journal of Solid-State Circuits,* vol.25, No.6, December 1990, pp.1328–1338 The two-step ADC trades speed for smaller layout area and lower power consumption, and it also has the potential for high-resolution applications.

Normally, the outputs of comparators in the flash-type ADC form a thermal code. Then, a priority encoder is used to convert the thermal code into a binary code or a binary-coded-decimal (BCD) code for further processing. The thermal code must satisfy high resolution requirements, but this makes it susceptible to process variation or noise interference, and thus it suffers from bubble errors. The bubble is an output code quite deviant from the input value and occurs sporadically. For example, a 10-bit two-step ADC with a reference range of 2V needs to differentiate about 2 mV ($2V/2^{10}$) prior to the generation of the thermal code. Such tiny voltage difference makes the outputs of comparators quite sensitive to process variation and noise interference. For instance, noise may be induced and may interfere with the outputs of the comparators while the comparators are activated simultaneously.

To overcome the aforementioned problem, Yuji Gendai et al. have proposed "AN 8b 500 MHz ADC" in 1991 *IEEE International Solid State Circuits Conference,* which utilizes a differentiator to detect a transient point in a thermal code, and also uses two encoders to average the detected results. However, while Gendais circuit may be quite suited to dealing with those bubble errors whose occurrence is predictable, it will be unable to deal with bubble errors that occur randomly.

SUMMARY OF TEE INVENTION

Therefore, one object of the present invention is to provide a circuit and to eliminate bubble errors occurring in a thermal code even though the bubbles occur randomly.

Another object of the present invention is to provide an electronic bubble evaporation circuit, which rearranges a thermal code and removes the bubbles contained therein before binary coding occurs.

The present invention achieves the above-indicated objects by providing a circuit for eliminating bubble errors occurring in a thermal code, the circuit being comprised of a plurality of data bits. The circuit is implemented by a plurality of interchange units, each of which processes one of the data bits respectively. When any two successive data bits present a predetermined pattern, an interchange operation between the associated interchange units is continuously performed until the predetermined pattern is completely removed Therefore, an electronic bubble evaporation circuit developed in accordance with the present invention can eliminate bubble errors occurring in the thermal code even if the bubbles occur randomly.

Further another object of the present invention is to provide a method for eliminating bubble errors occurring in a thermal code.

The present invention achieves the above-indicated object by providing a method of eliminating bubble error happening to a thermal code having a plurality of data bits, each of which is processed by an interchange unit. First of all, whether any two successive data bits present a predetermined pattern is determined. Then, an interchange operation between said associated interchange units is unceasingly performed when any two successive data bits present the predetermined pattern until the predetermined pattern is completely removed.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

The following detailed description is based on the example of a 9-bit thermal code, and is not intended to limit the invention solely to the embodiment described herein. Intuitively, the bubble evaporation circuit is suited to processing any n-bit thermal code so as to remove bubble errors, for which n is a positive integer.

Figure 1A:
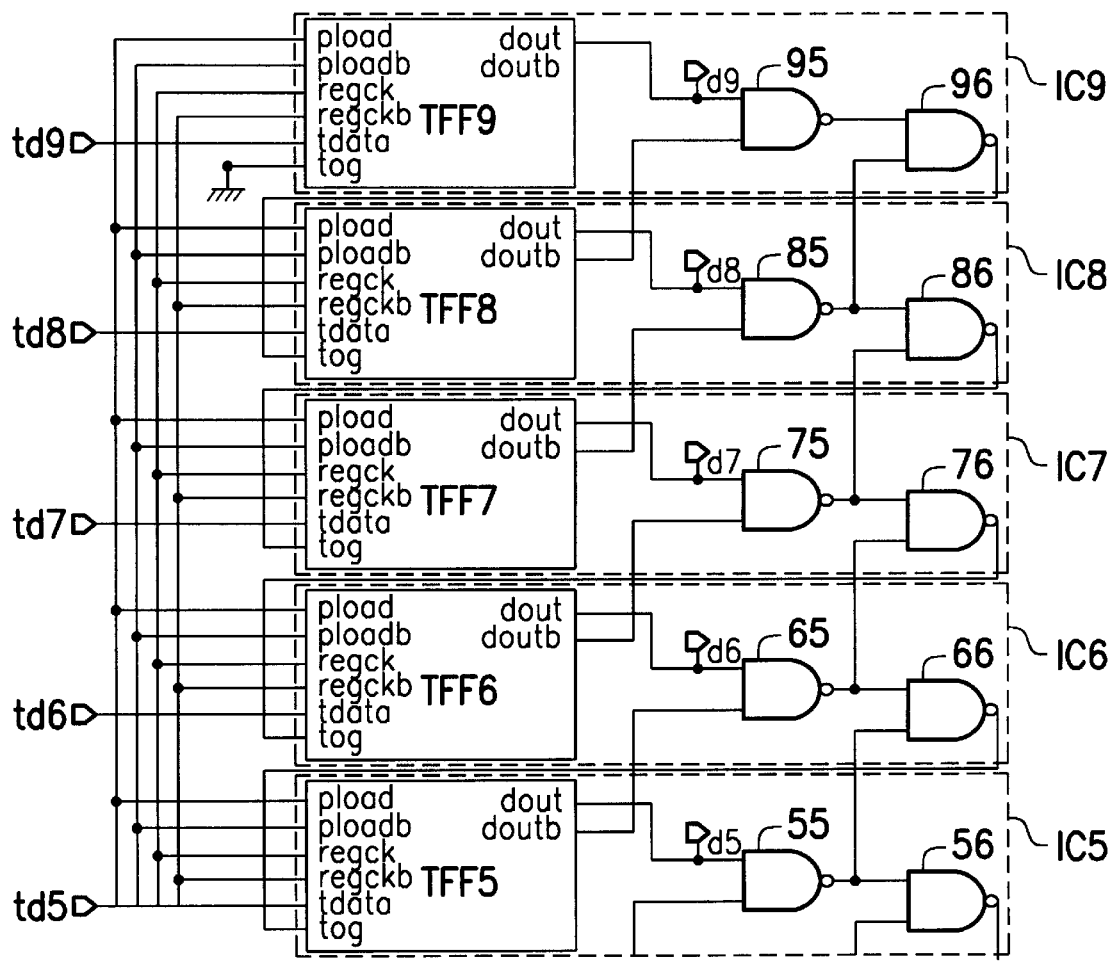
FIGS. 1A and 1B schematically depicts the circuit diagram of one preferred embodiment in accordance with the present invention.
Figure 1B:
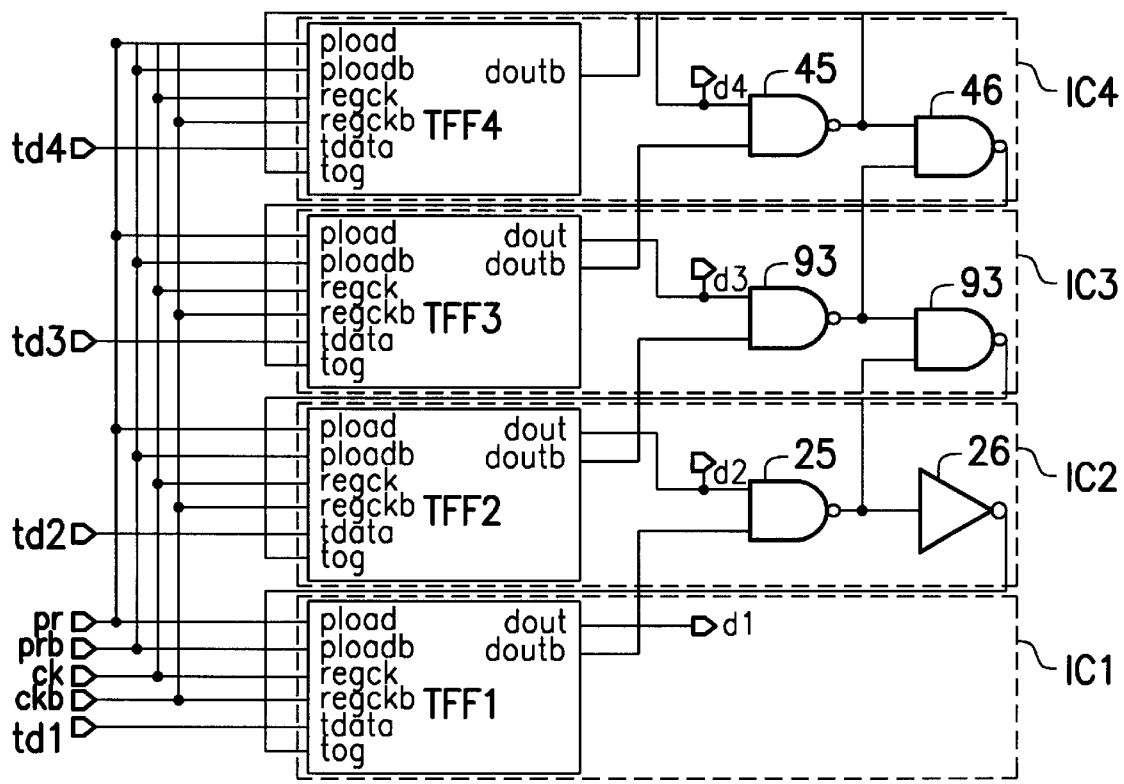

Referring to FIGS. 1A and 1B, the circuit diagram of one preferred embodiment designed in accordance with the present invention is schematically illustrated. In the drawing, there are nine interchange units referred to IC9, IC8, IC7, IC6, IC5, ICE, IC3, IC2, IC1, respectively. A 9-bit thermal code is comprised of nine data bits, that is td9, td8, td7, td6, td5, td4, td3, td2, and td1 in parallel form, inputting to the interchange units, IC9, IC8, IC7, IC6, IC5, IC4, IC3, IC2, IC1, respectively. Normally, the thermal code coming from the outputs of the associated comparators (not shown in the drawing) has only one transient point; that is, the patterns of all logic-highs (1s), all logic-lows (0s), or a portion of successive logic-highs (1s) and another portion of successive logic-lows (0s) are feasible. Assuming that the thermal code suffers from bubble errors due to noise interference or process variation, then the resulting thermal code (td9,td8,td7,td6,td5,td4,td3,td2,td1) would be (001011011) for example. Note that the bit td6 set to logic-low abnormally occurs between the bit td7 and the bit td5, both of which are set to be logic-high. In addition, the bit td3 set to logic-low is abnormally positioned between the bit td4 and the bit td2, both of which are set to logic-high.

Consequently, the bits td6 and td3 involve bubbles occurring to the thermal code.

The data bits, td9, td8, td7, td6, td5, td4, td3, td2 and td1 of the thermal code are applied into the interchange units, IC9, IC8, IC7, IC6, IC5, IC4, IC3, IC2 and IC1, respectively. The outputs of the interchange units IC9–IC1 are referred to as d9, d8, d7, d6, d5, d4, d3, d2, and d1. In addition, a present signal pr and a system clock signal ck are applied to each of the interchange units IC9, IC8, IC7, IC6, IC5, IC4, IC3, IC2, IC1, while another system clock ckb is the complement of ck and another preset signal prb is the complement of pr. The preset signal pr is used to enable the data-loading operation so that the data bits, td9, td8, td7, td6, td5, td4, td3, td2 and td1 of the thermal code are loaded into the interchange units IC9–IC1 and latched at the outputs d9, d8, d7, d6, d5, d4, d3, d2, and d1, respectively. The system clock signal ck is utilized to synchronize the interchange operations (which will be described below) among those interchange units, IC9, IC8, IC7, IC6, IC5, IC4, IC3, IC2, and IC1.

Figure 2:
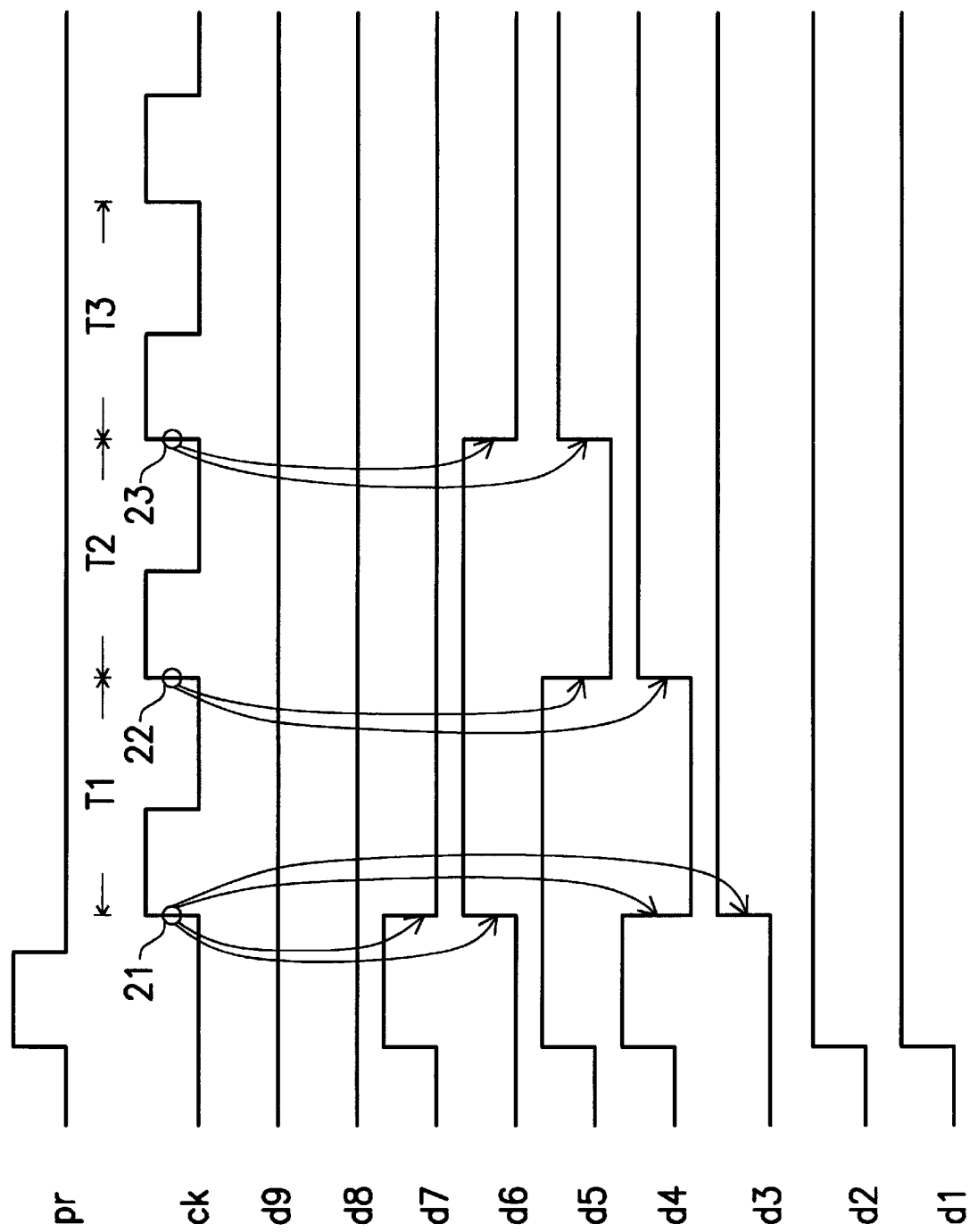
FIG. 2 is the timing diagram of FIGS. 1A and 1B.

As the 9-bit thermal code of (001011011) is exemplified, the output code (d9,d8,d7,d6,d5,d4,d3,d2,d1) is set to (0,0,1,0,1,1,0,1,1) when the preset signal pr changes from 0 to 1 as shown in FIG. 2. For the sake of simplicity in describing the present invention, d9 is as the most significant bit (MSB), and d1 as the least significant bit (LSB) in this preferred embodiment. Then the interchange operations are performed via the following clock pulses.

In this preferred embodiment, the interchange operation between the associated interchange units is activated while every two successive output bits present the pattern of "10" so as to change "10" to "01" when the state of the system clock signal ck goes from 1 to 0.

Howeverm there is no interchange operation when every two successive output bits present the logic pattern of "11", "00", or "01". Referring to FIG. 2, the output code (d9,d8,d7,d6,d5,d4,d3,d2,d1) is set to (0,0,1,0,1,1,0,1,1) after the present cycle, wherein (d7,d6) and (d4,d3) present the pattern of (1,0). Then, the pair of the interchange units IC7 and IC6 and the pair of the interchange units IC4 and IC3 are simultaneously enabled to perform the interchange operation which changes the pattern of "10" to "01" during the rising edge 21 of a following first clock cycle $T_1$. Therefore, the output code (d9,d8,d7,d6,d5,d4,d3,d2,d1) is changed to (0,0,0,1,1,0,1,1,1), during the following first clock cycle $T_1$. As a result, (d5,d4) presents the pattern of (1,0) so that the pair of the interchange units IC5 and IC4 is enabled to perform the interchange operation so as to change the pattern of "10" to "01" during the rising edge 22 of a following second clock cycle $T_z$. After that, the resulting output code (d9,d8,d7,d6,d5,d4,d3,d2,d1) is changed to (0,0,0,1,0,1,1,1,1), during the following second clock cycle $T_2$. For the same reason, the pair of the interchange units IC6 and IC5 is enabled to perform the interchange operation so as to change the pattern of "10" to "01" during the rising edge, and the resulting output code (d9,d8,d7,d6,d5,d4,d3,d2,d1) is changed to (0,0,0,0,1,1,1,1,1) during a following third clock cycle $T_3$. The process of interchange operations is referred to as bubble evaporation.

With further reference to FIGS. 1A and 1B, nine toggle flip-flops TFF9–TFF1 are principally utilized to implement the interchange units IC9–IC1, respectively. Each of the toggle flip-flops TFF9–TFF1 has a pre-load input pload connected to the preset signal pr, a clock input regck receiving the system clock signal ck, a data input tdata for receiving the associated data bit tdx (one of td9–td1), a data output dout for outputting the associated output bit dx (one of d9–d1), a toggle input tog, etc. In addition, each of the toggle flip-flops TFF9–TFF1 has a complementary pre-load input ploadb, which is the complement of pload, a complementary clock input regckb, which is the complement of regck, and a complementary data output doutb, which is the complement of dout.

In addition to the toggle flip-flops TFF9–TFF1, the interchange unit IC9 further comprises two NAND gates 95 and 96, IC8 comprises two NAND gates 85 and 86, IC7 comprises two NAND gates 75 and 76, IC6 comprises two NAND gates 65 and 66, IC5 further comprises two NAND gates 55 and 56, IC4 comprises two NAND gates 45 and 46, unit IC3 comprises two NAND gates 35 and 36, IC2 comprises one NAND gates 25 and one inverter 26.

In the drawing, b9 and b8' (bx' means the complement of bx) are applied to inputs of the NAND gate 95, then the outputs of the NAND gates 95 and 85 are applied as inputs of the NAND gate 96, and the output of the NAND gate 96 is applied to the toggle input tog of the toggle flip-flop TFF8. Similarly, b8 and b7' are applied to inputs of the NAND gate 85, then the outputs of the NAND gates 85 and 75 are applied as inputs of the NAND gate 86, and the output of the NAND gate 86 is applied to the toggle input tog of the toggle flip-flop TFF7. The connection within the interchange units IC7–IC3 is similar to that within IC8, and therefore it is unnecessary to describe it in further detail. However, b2 and b1' are applied to the inputs of the NAND gate 25, then the output of the NAND gates 25 is applied to the inverter 26, and the output of the inverter 26 is applied to the toggle input tog of the toggle flip-flop TFF1. Note that the toggle input tog is grounded.

Based on the circuit depicted in FIG. 1, assume that (d9,d8,d7,d6,d5,d4,d3,d2,d1) is set to (0,0,1,0,1,1,0,1,1) after the present cycle, that the outputs of NAND gates 86, 76, 56, and 46 are all set to 1, and then applied to the toggle inputs of the toggle flip-flops TTF7, TTF6, TTF4, and TTF3, respectively, so that the output bits d7, d6, d4, and d3 are inverted at the rising edge 21 of the first clock cycle $T_1$. Accordingly, the output code (d9,d8,d7,d6,d5,d4,d3,d2,d1) is held to (0,0,0,1,1,0,1,1,1) and the outputs of the NAND gates 66 and 56 are set to 1 applied to the toggle inputs of the toggle flip-flops TTF5, TTF4 during the first clock cycle $T_1$. At the rising-edge 22 of the second clock cycle $T_2$, the output bits d5 and d4 are inverted so that the output code (d9,d8,d7,d6,d5,d4,d3,d2,d1) is set to (0,0,0,1,0,1,1,1,1). For the same reason, the output code (d9,d8,d7,d6,d5,d4,d3,d2,d1) will be set to (0,0,0,0,1,1,1,1,1) at the ring-edge 23 of the third clock cycle $T_3$ accordingly. In these circumstances the bubble errors occurring in the thermal code are achieved, and a priority encoder may be thereafter provided to convert the corrected thermal code into a binary code or a binary-coded-decimal (BCD) code for further processing.

In conclusion, the circuit for removing bubble errors occurring in the thermal code works by a process known as bubble evaporation. In accordance with the present invention, a plurality of interchange units is required to implement the circuit. The interchange operation between the associated interchange units is activated where any two successive output bits present the predetermined pattern. The interchange operations will be continued until all the predetermined patterns are removed. Accordingly, the electronic bubble evaporation circuit developed in accordance with the present invention can eliminate bubble errors happening to the thermal code even if the bubbles occur randomly.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention, to practice various other embodiments and to make various modifications suited to the particular use contemplated. It is intended that the scope of the invention be defined by the following claims and their equivalents.

What is claimed is:

1. A circuit for eliminating bubble error happening to a thermal code, which is comprised of a plurality of data bits; said circuit comprising a plurality of interchange units for processing one of said data bits, respectively; wherein an interchange operation between said associated interchange units is unceasingly performed when any two successive said data bits present a predetermined logic pattern until said predetermined logic pattern is completely removed.

2. The circuit as claimed in claim 1, wherein each said interchange unit comprises a toggle flip-flop which triggers said interchange operation.

3. The circuit as claimed in claim 2, wherein said predetermined logic pattern is (10).

4. The circuit as claimed in claim 3, wherein said interchange operation is an operation of logic negation.

5. A method of eliminating bubble error happening to a thermal code having a plurality of data bits, each of which is processed by an interchange unit, said method comprising the following steps:

(a) determining whether any two successive said data bits present a predetermined pattern; and (b) unceasingly performing an interchange operation between said associated interchange units when any two successive said data bits present said predetermined pattern until said predetermined pattern is completely removed.

6. The method as claimed in claim 5, wherein each said interchange unit is implemented by a toggle flip-flop which triggers said interchange operation.

7. The method as claimed in claim 5, wherein said predetermined logic pattern is (10).

8. The method as claimed in claim 5, wherein said interchange operation is an operation of logic negation.

* * * * *